United States Patent [19]

Chennakeshu et al.

[11] Patent Number: 5,151,926
[45] Date of Patent: Sep. 29, 1992

[54] SAMPLE TIMING AND CARRIER FREQUENCY ESTIMATION CIRCUIT FOR SINE-COSINE DETECTORS

[75] Inventors: Sandeep Chennakeshu, Clifton Park; Gary J. Saulnier, Rexford, both of N.Y.

[73] Assignee: General Electric Company, Schenectady, N.Y.

[21] Appl. No.: 703,516

[22] Filed: May 21, 1991

[51] Int. Cl.$^5$ ............................................. H04L 27/22
[52] U.S. Cl. ..................................... 375/84; 329/304
[58] Field of Search ........................ 375/52, 83, 84; 455/205; 329/304, 308; 379/58, 59

[56] References Cited

U.S. PATENT DOCUMENTS

| | | | |
|---|---|---|---|
| 3,993,956 | 11/1976 | Gilmore et al. | 375/84 |
| 4,608,540 | 8/1986 | Tsuchiya et al. | 329/311 |
| 5,029,186 | 7/1991 | Maseng et al. | 375/94 |

OTHER PUBLICATIONS

T. S. Rappaport, S. Y. Seidel and R. Singh, "900 MHZ Multipath Propagation Measurements for U.S. Digital Cellular Radiotelephone," IEEE Globecom Conference Record, Nov. 1989, Dallas, TX vol. 1, pp. 3.2.1–3.2.6.

Motorola, Inc., Arlington Heights, Ill. "Discussion of Pi/4 Shift DQPSK," Submitted to the TIA Technical Subcommittee, TR-45.3 WG III Modulation Task Force, Washington, DC pp. 1–13.

G. J. Saulnier; C. McD. Puckette, IV;R. C. Gaus, Jr.; R. J. Dunki-Jacobs and T. E. Thiel, "A VLSI Demodulator for Digital RF Network Applications: Theory and Results," IEEE Journal on selected Areas in Communications, Oct. 1990, vol. 8, No. 8, pp. 1500–1511.

Primary Examiner—Stephen Chin
Attorney, Agent, or Firm—Lawrence P. Zale; James C. Davis, Jr.; Marvin Snyder

[57] ABSTRACT

A digital radio receiver for synchronization of radiowave transmissions for digital and analog FM signals in TDMA systems such as cellular telephones uses a Sine/Cosine detector that minimizes the bit error rate. The detector employs an A/D converter, a sorter circuit that produces a predetermined number of samples to be used in the decoding based upon a sample timing adjustment, and a sample and phase adjustment circuit that selects samples based on a sample timing adjustment and adds a carrier phase adjustment to the samples. A cosine detector and a sine detector each decode samples into signals that are measured by a cosine level check circuit and a sine level check circit respectively. A decision logic circuit produces a pair of bits from the levels detected by the cosine level check circuit and the sine level check circuit as the decoded transmitted information. Adjustments to the sample timing and carrier phase are performed by an adjustment circuit that monitors the phase error between the decoded information and a predetermined information set in the preamble of each TDMA slot. The adjustment circuit sends the sample timing and carrier phase adjustments to the SPA circuit which selects different samples to be decoded and uses the carrier phase adjustment to recalculate different coefficients from these samples and pass the signal through the remainder of the circuit and eventually to the adjustment circuit. The signal is iteratively cycled through this loop until the best sample timing and carrier phase adjustments are reached.

12 Claims, 8 Drawing Sheets

SAMPLE TIMING AND CARRIER FREQUENCY ESTIMATION CIRCUIT FOR SINE-COSINE DETECTORS

CROSS REFERENCE TO RELATED APPLICATIONS

This application is related to applications "DIGITAL DISCRIMINATOR FOR PULSE SHAPED $\pi/4$ SHIFTED DIFFERENTIALLY ENCODED QUADRATURE PHASE SHIFT KEYING" by Sandeep Chennakeshu and G. J. Saulnier, and also "TANGENTAL TYPE DIFFERENTIAL DETECTOR FOR PULSE SHIFT KEYING" by Sandeep Chennakeshu and G. J. Saulnier, both filed simultaneously with this application, and also assigned to the present assignee. These applications are hereby incorporated by reference.

BACKGROUND OF THE INVENTION

1. Field of the Invention

This invention relates to digital radio systems, and more specifically, to demodulation of a transmitted signal and synchronization between the transmitter and receiver of digital radio systems.

2. Description of Related Art

The U.S. digital cellular telephone system uses time division multiple access (TDMA) as the channel access method. In this system, typically 3 to 6 users (data channels) share a common 30 KHz channel. Each user transmits data in an assigned time slot that is a part of a larger frame. Typically the gross bit rate of the data to be transmitted over the mobile channel is 48.6 kilobits per second (kbps). The modulation method is $\pi/4$ shifted-Differentially encoded Quadrature Phase Shift Keying (DQPSK). A typical system uses a Square Root Raised Cosine transmit pulse shape for a transmission signal with a roll-off of 0.35, or an excess bandwidth of 35% to shape the transmitted data. A filter having an impulse response matched to the transmit pulse shape is used in the receiver. Coherent detection, differential detection, or discriminator detection may be used to demodulate signals encoded by $\pi/4$-shifted-DQPSK techniques.

Disturbances due to multipath propagation affect the digital cellular transmission and require the use of an equalizer in the receiver. Equalizers employ coherent demodulation and are complex to implement. With the current technology, the complexity of an equalizer makes its use in portable radio receivers impractical. For such applications a digital discriminator or a differential detector is more suitable. These receivers are simple and can be implemented on a commercial digital signal processor (DSP), which forms the core of a modern digital mobile radio receiver.

When transmission introduces echoes in the received signal, called multipath propagation, the bit error rate (BER) performance of these detectors degrades very rapidly. Multipath propagation manifests itself in dispersion of the transmitted signal. This dispersion is characterized by a quantity called delay spread. Delay spread can be defined as the time interval between the first arriving signal and last significant echo. However, in most regions of cellular operation in the U.S., the root mean square (RMS) delay spread will not exceed 14 microseconds or approximately 34% of a symbol duration at this transmission rate (see, T. S. Rappaport, S. Y. Seidel and R. Singh, "900 MHz Multipath Propagation Measurements for U.S. Digital Cellular Radiotelephone", IEEE GIobecom Conference Record, Vol. 1, pp. 3.2.1–3.2.6, Nov. 1989, Dallas, Tex.) and hence degradation can be expected to be within acceptable limits.

The conventional discriminator comprises the following sequence of processing functions: limiting, differentiation, envelope detection, and integration. Specifically, after the RF signal is received, it is heterodyned down by conventional methods to an intermediate frequency (IF). The signal is then limited by normalizing its amplitude to a constant value with a limiter. A differentiator and an envelope detector convert frequency to a signal voltage. This type of discriminator can also be used to demodulate analog FM and digital $\pi/4$-shifted-DQPSK signals (see, "Discussion of $\pi/4$-Shifted-DQPSK", TR45.3.3/89.3.14.5, submitted to TIA Technical Subcommittee TR45.3, WG III, Modulation Task Group, Mar. 14, 1989, available from the Electronics Industries Assoc., Engineering Dept., 2001 Eye Street, N.W., Washington, D.C. 20006). A problem with the above conventional discriminator is the presence of the limiter. The limiter makes the discriminator sensitive to the pulse shaping roll-off factor of the transmitted pulse signal. An increase in BER occurs by reducing the roll-off factors or by reducing the excess bandwidth of the transmitted signal. This puts a restriction on the data rate and the filtering in the system.

A second problem is the recovery of symbol timing and carrier frequency error correction. Typically, these conventional discriminators require additional circuits having phase locked loops (PLLs) to perform these functions.

It would be advantageous to create a simplified detector that does not require a limiter, but is able to recover from symbol timing and correct carrier frequency errors.

SUMMARY OF INVENTION

A digital receiver employing a Sine/Cosine detector for demodulating $\pi/4$-shifted-DQPSK signals and providing synchronization in a TDMA system such as digital cellular telephones is provided for receiving a radio frequency signal and converting it to an intermediate frequency (IF) signal in a heterodyne circuit. An analog-to-digital (A/D) converter circuit that employs complex sampling of the IF signal is used to produce the baseband (low pass) signal. This baseband signal comprises a quadrature coefficient and an in-phase coefficient for each sample of the IF signal. A predetermined number of samples comprise a symbol. The number of samples per symbol is referred to as $N_s$. The samples are passed to a sorter circuit that selects samples to be used in the decoding.

A sample and phase adjustment (SPA) circuit receives a pair of coefficients for each sample and selects $N_s$ samples for each symbol of the received signal based upon a sample timings. The SPA circuit also receives as a feedback signal a carrier phase adjustment and converts each sample it receives to a new quadrature coefficient and in-phase coefficient based upon this adjustment.

The in-phase and quadrature coefficients are sent to a cosine detector directly, and are also sent through a pair of delay circuits to the cosine detector. The cosine detector determines a cosine of the change of a phase angle occurring since the last sampling instant encoded in the delayed and directly-sent coefficients. A cosine level check circuit creates an output signal based upon this cosine signal.

Similarly the in-phase and quadrature coefficients are sent to a sine detector directly, and also sent to the delay circuits then to the sine detector. The sine detector determines the sine of the change of a phase angle since the last sampling instant encoded in the delayed and directly sent coefficients. The samples from the sine detector are sent to a sine level check circuit creating an output signal.

The output signals of the sine level check circuit and the cosine level check circuit are passed to a decision logic circuit that decodes a pair of bits from the level check circuit information.

Adjustments to the sample timing and carrier phase are performed by an adjustment circuit that monitors the error between the decoded information and a predetermined information set (reference phase angles) in the preamble of each TDMA slot. The adjustment circuit sends the sample timing and carrier phase adjustments to the SPA circuit. The SPA circuit selects the best sample index within each symbol from the point of reducing the bit error rate to be decoded. The SPA circuit also uses the carrier phase adjustment to recalculate different coefficients from these samples and passes the signal to the delay circuits, the cosine detector, and the sine detector. The output signal from the cosine detector is passed to an inverse cosine circuit, which decodes the cosine signal to a phase angle. The phase angle signal is passed to the adjustment circuit. The signal is iteratively cycled through this loop until the best sample timing and carrier phase adjustments are determined.

OBJECTS OF THE INVENTION

An object of the present invention is to create a simplified receiver for digital radio systems employing a detector that does not require a limiter and is able to recover symbol timing and correct carrier frequency errors.

Another object of the invention is to provide a simplified receiver for digital radio systems employing a detector that is able to decode both digital and analog signals.

A further object of the invention is to provide a simplified receiver for digital radio systems employing a detector that can quickly recognize and adjust to frequency differences between the transmitter and the receiver oscillators.

A further object of the invention is to provide a simplified receiver for digital radio systems employing a detector having a reduced bit error rate that is not sensitive to the degree of roll-off in the transmit pulses.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE PREFERRED EMBODIMENT

Figure 1:
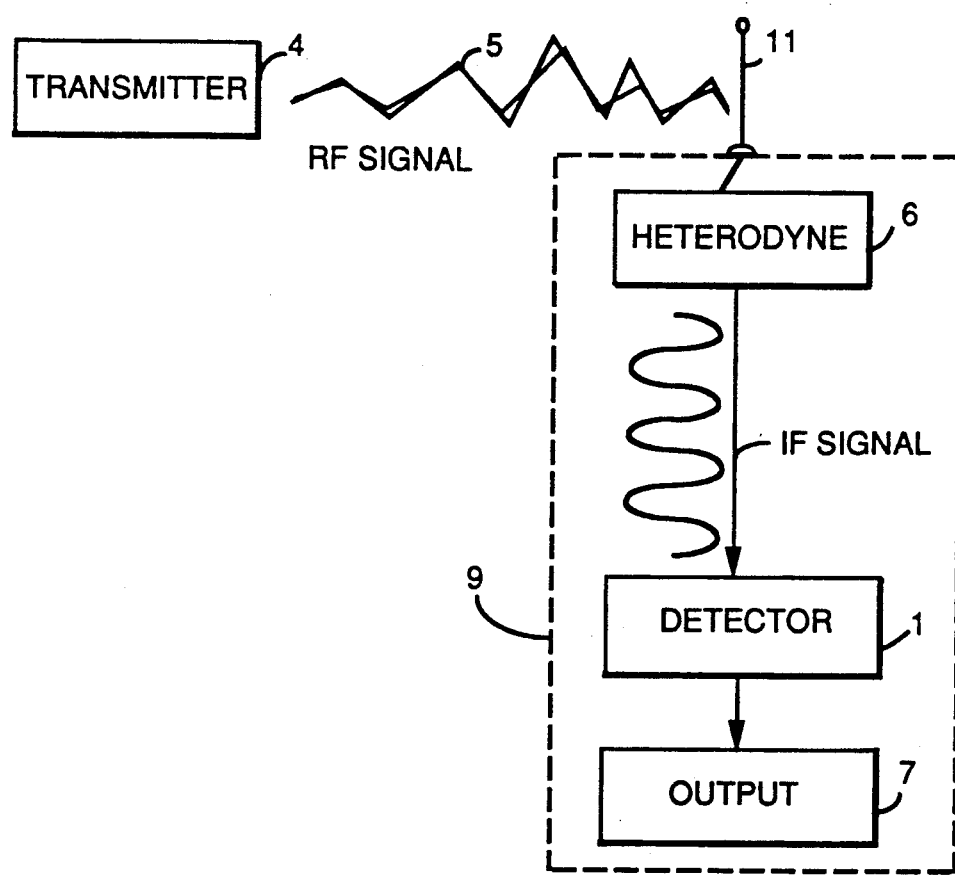
FIG. 1 is a block diagram of a generalized digital radio system.

FIG. 1 illustrates a block diagram of a generalized digital radio system. Transmitter 4 transmits an encoded digital signal via radio waves as RF signal 5. This is received at an antenna 11 of receiver 9. The received RF signal 5, being approximately 900 MHz, is heterodyned down by heterodyne circuit 6 to an IF frequency 3 of approximately 450-500 kHz. The IF signal 3 is then passed to detector 1. The detector 1 decodes the IF signal into a signal which can be utilized by output means 7. Output means 7 can be a speech synthesizer and loud speaker to produce audible speech, a digital computer, or any other device which can make use of digital data.

Figure 2:
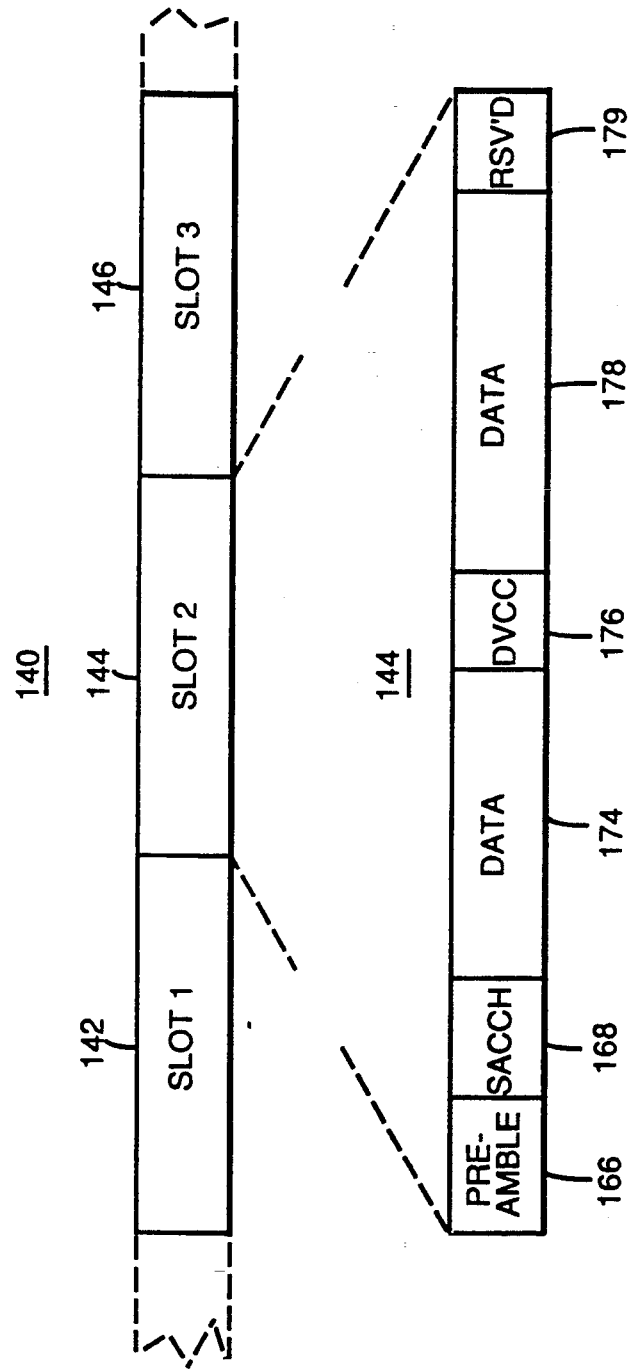
FIG. 2a illustrates a TDMA frame structure.
FIG. 2b illustrates the Electronics Industries Assoc. IS-54 slot structure for base station to mobile station transmission.

FIG. 2a illustrates a basic TDMA frame structure. The TDMA frame structure 140 is broken down into a number of TDMA slots 142, 144, 146. FIG. 2b shows the Electronics Industries Assoc. IS-54 slot structure (for example slot 2 of FIG. 2a) for base to mobile transmissions used in U.S. digital cellular systems. This slot structure begins with a preamble 166 being 28 bits long that contains synchronization words. Twelve slow associated control channel (SACCH) bits 168 are next. Data bits 174, being 130 bits long, follow SACCH bits 168. Twelve Digital Verification Color Code (DVCC) bits 176, 130 data bits 178 and twelve reserved bits are at the end of the slot.

Figure 3:
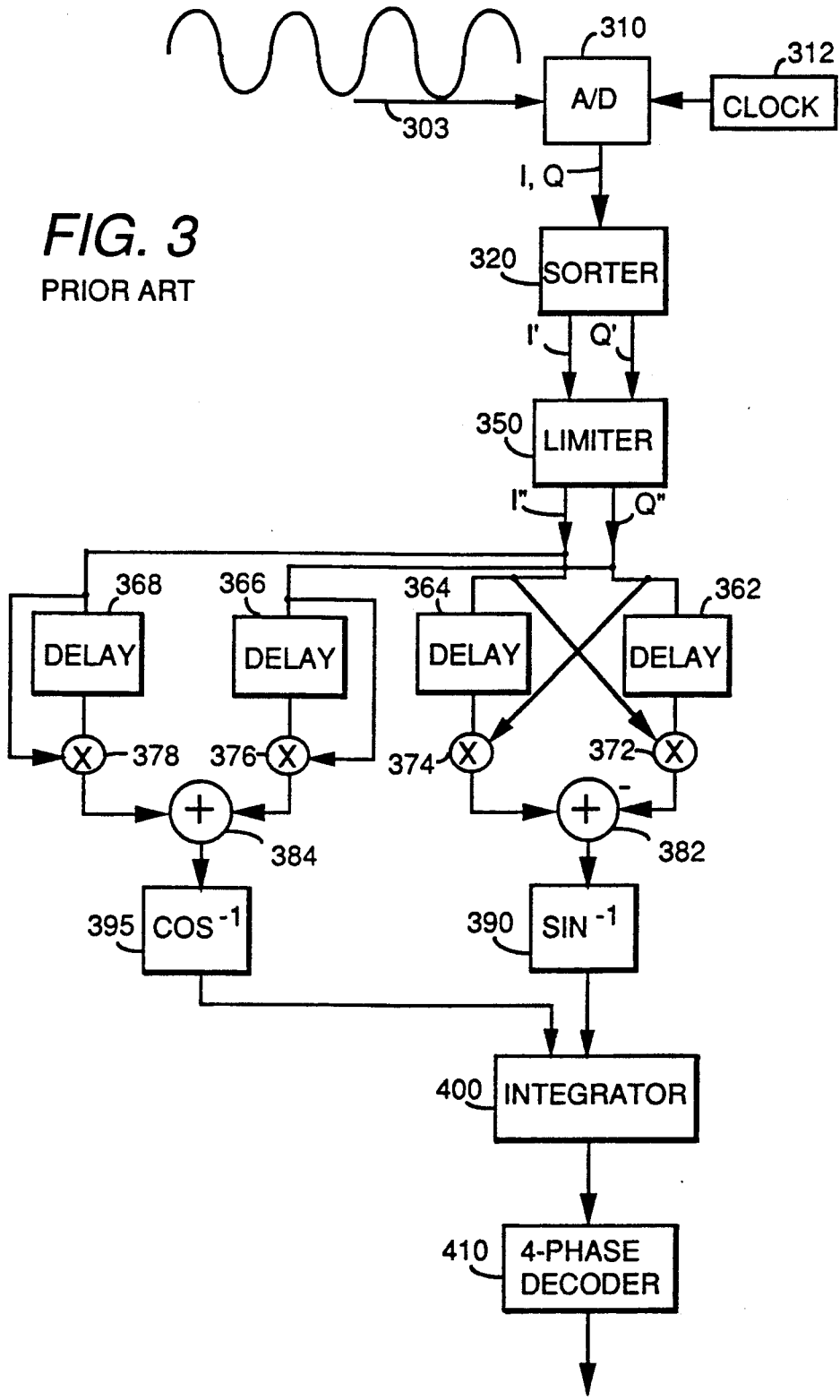
FIG. 3 is a block diagram of a prior art digital discriminator.

A conventional discriminator can be realized digitally as illustrated in FIG. 3. In this case the limiter has to be realized at the low-pass stage in the receiver due to the direct digital conversion method used.

In this discriminator, an RF signal is converted to an IF signal 303 and substantially digitized through A/D converter 310 into samples (I,Q). The sampling rate is governed by sampling clock 312 running at four times the IF frequency. Sorter 320 selects samples (I',Q') to be used in decoding and discards the remaining samples. The coefficients (I',Q') are sent to limiter 350.

The output signal I" from limiter 350 is multiplied in multiplier 372 by the previous Q" sample that is temporarily held in delay circuit 362. Similarly the output signal Q" is multiplied in multiplier 374 with the previous I" sample which is held for a temporary period in delay circuit 364. The output signals of multipliers 372 and 374 are sent to summer 382 in which the signal from multiplier 372 is subtracted from the signal from multiplier 374. Inverse sine circuit 390 receives the output signal of summer 382 and creates an output signal corresponding to an inverse sine of the signals received.

Signal I" is multiplied at multiplier 378 by a previous sample of I" that is held in delay circuit 368. Similarly multiplier 376 multiplies the output signal Q" by a previous sample of Q" that is held in delay circuit 366. The output signals of multipliers 376 and 378 are added in summer circuit 384 to produce an output signal that is received by the inverse cosine circuit 395. The inverse cosine circuit 395 creates an output signal that is related to its input signal by an inverse cosine function. An integrator 400 receives the output signals of either the inverse sine circuit 390 or the inverse cosine circuit 395 and sums all the signals over a sampling period. A four-phase decoder 410 receives the output signal of the integrator 400 and decodes the phase into a pair of bits for each symbol. (In the case of an analog FM signal the four-phase decoder 410 and integrator 400 are not required.)

Figure 4:
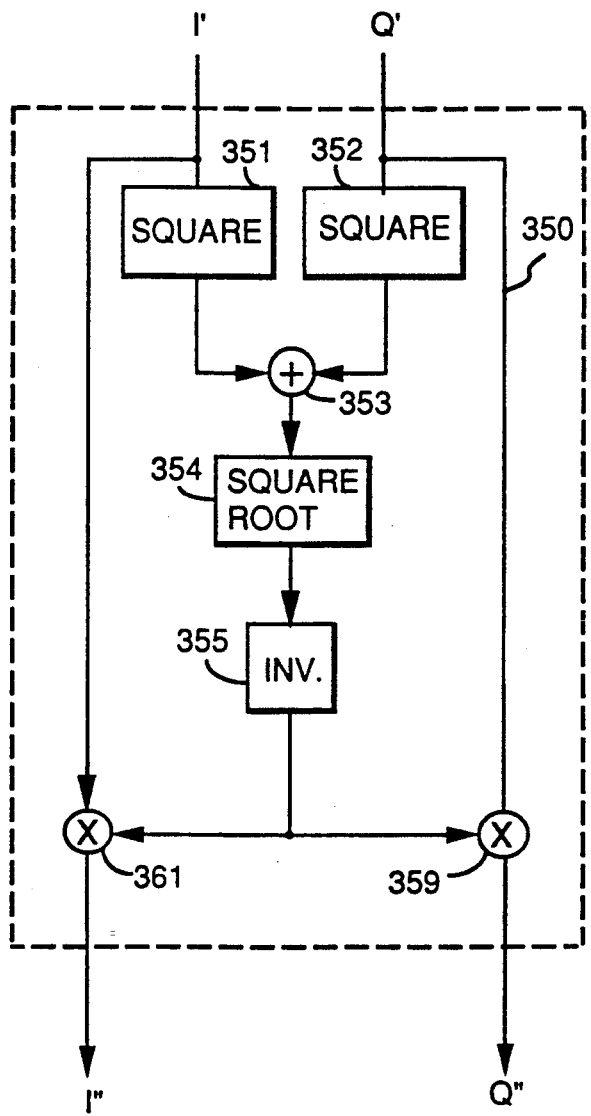
FIG. 4 is a block diagram of the limiter of FIG. 3.

FIG. 4 shows an expanded view of the limiter 350. A square circuit 351 receives signal I' and squares the signal amplitude. A second square circuit 352 receives signal Q' and squares the signal amplitude. Summer 353 receives the signals from square circuits 351 and 352 and adds the two amplitudes. Summer 353 passes its output signal to square root circuit 354 that takes the square root of the output signal of the summer 353. Inverter 355 creates an output signal that is the reciprocal value of its input signal and sends it to multipliers 359 and 361. The output signal I'' of multiplier 361 is original signal I' that is multiplied by the signal from inverter 355. Similarly, the output signal Q'' of multiplier 359 is the product of Q' and the output signal from inverter 355. The output signal of limiter 350 is a normalized signal, comprising the output signals of multiplier 359 and multiplier 361.

Figure 5:
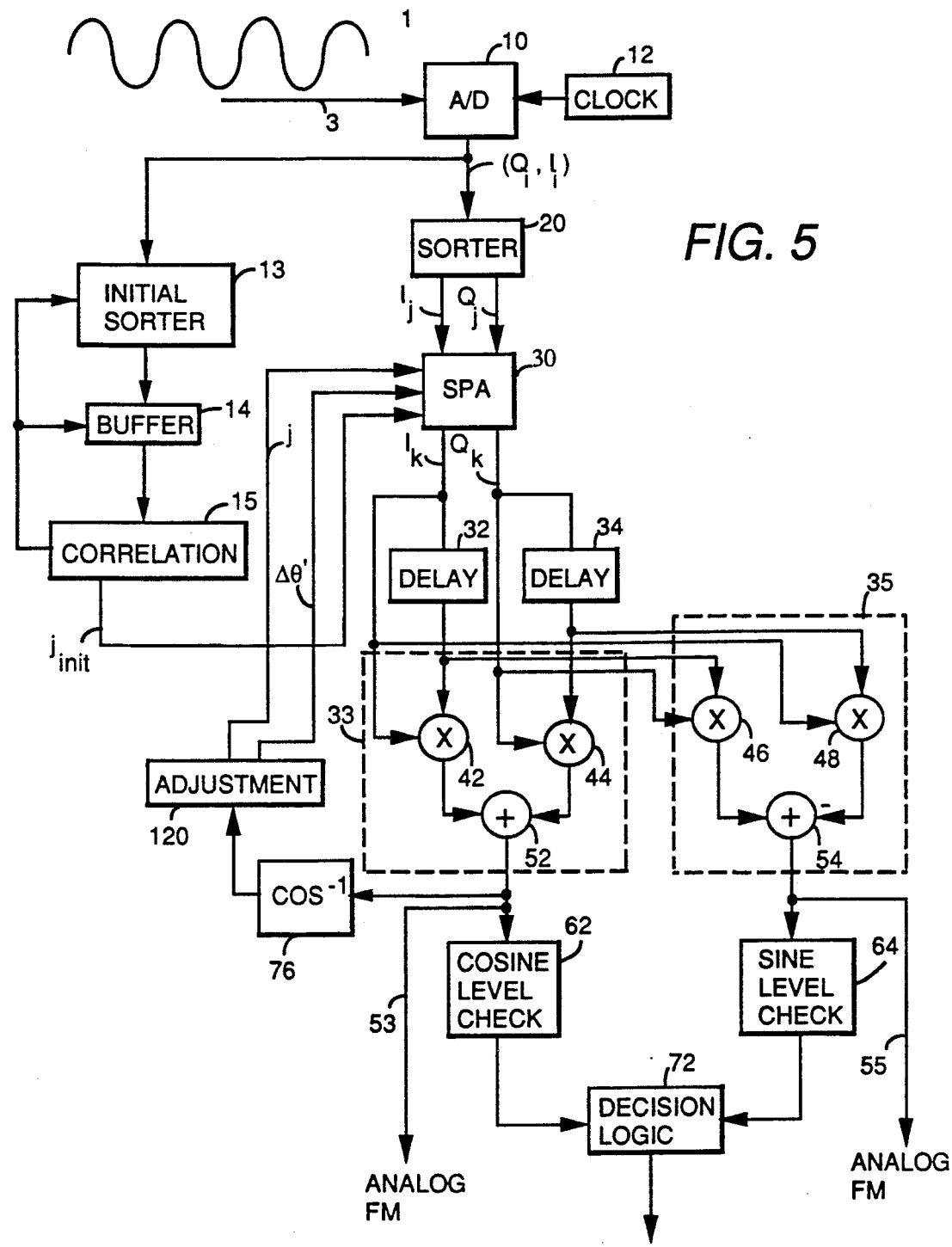
FIG. 5 is a simplified block diagram of one embodiment of a detector of the present invention.

FIG. 5 is a partial block diagram of a receiver for digital radio systems according to the present invention. FIG. 5 represents the discriminator 1 of FIG. 1. The IF signal 3 is converted to baseband using direct digital conversion. This conversion is accomplished by a flash A/D converter circuit 10 sampling the signal at four times the IF frequency or approximately 1800k samples/second. The sampling rate is governed by the sampling clock 12. The samples are quadrature shift keyed (QPSK) samples. The result is a pair of coefficients from each sample, being an in-phase coefficient $I_i$, and a quadrature coefficient $Q_i$, of the baseband $\pi/4$-shifted-DQPSK signal.

The invention operates by first establishing frame/slot synchronization to find a rough sample index. This is done by first selecting a number of samples with an initial sorter and storing these samples in a buffer 14. A correlation circuit 15 correlates a number of buffered samples pertaining to the length of the preamble 166 of FIG. 2b starting from an index with the predetermined preamble. The index marking the starting sample from which the received signal was correlated is incremented to the next sample. A number of symbols are selected, starting from the sample marked by the incremented index. This process of selecting samples and cross-correlating them with the preamble is repeated for several frames until the correlation produces several successive peaks that exceed a certain predetermined threshold. This sample index, $j_{init}$, is assumed to be the beginning of a frame/slot. Since the number of samples in a frame is known, the beginning of the next frame can be calculated by incrementing the sample index by the number of samples that are in a frame. The correlation circuit then repeats the correlation process at the new sample index. If the correlation between the known preamble and the received symbols is above predetermined threshold at this index, it can be assumed that this is the beginning of the next frame. If the correlation between the received symbols and the preamble is below the predetermined threshold, the search is started at the beginning again. If three successive correlation peaks are found, the frame/slot synchronization is complete, and the sample index $j_{init}$ is used as a starting point for a fine adjustment called symbol synchronization.

In symbol synchronization, a sorter circuit 20 processes the sequential string of samples $(I_i,Q_i)$ by retaining a predetermined number of samples and discarding the remaining samples, since most of these samples are redundant. The samples retained are determined by the sampling index j starting with $j_{init}$. The present embodiment of sorter circuit 20 starts with a total of eighty samples per symbol and retains ten samples per symbol. The number of samples discarded can be any number described by n where $n=2*i$; and $i=1,3,5,7,9\ldots$ It must be noted that the greater the number of samples discarded, the shorter the processing time but the greater the timing error. For a further description of the functioning of the sorter circuit, please refer to "A VLSI demodulator for digital RF Network Applications: Theory and Results", G. J. Saulnier et al., IEEE Journal on Selected Areas in Communications, Vol. 8, No. 8, pp. 1500–1511 October 1990 hereby incorporated by reference.

In the present invention, prior to establishing sample timing it is necessary to synchronize to a TDMA frame/slot. This can be done using a correlation with the preamble sequence contained within each slot. Assume that this timing can be established to be within $\pm N_1$ ($\leq N_s$) samples of the true location, where $N_s$ represents the number of samples per symbol. Now, the best sample timing location must be selected from:

$$j = j_{init} \pm nT/N_s \qquad (1)$$

where T is a symbol period, $n=1,2,\ldots N_s$ and $j_{init}$ is the sample location corresponding to frame/slot sync.

In order to establish sample timing, as described by equation (1), and estimate carrier frequency offset a 2-dimensional search is performed to find the sample time and phase rotation (corresponding to the frequency offset) that will minimize the bit error rate.

The coefficients $(I_j,Q_j)$ that are retained by the sorter circuit 20 for a given sample index j are then selected in pairs and adjusted for any frequency offset by the SPA circuit 30. The SPA circuit 30 synthesizes a new pair of coefficients $(I_k,Q_k)$ from coefficients $(I_j,Q_j)$ using an estimated phase adjustment $\Delta\theta'_k$. The resulting signal coefficients $(I_k,Q_k)$ produced during a symbol interval can be described below. (For simplicity of notation and description it is implicitly assumed that there is no fading or noise present in the system.) The coefficients $(I_k,Q_k)$ produced during a symbol interval can be represented as:

$$I_k = g_k \cos(\phi_k + \Delta\theta_k - \Delta\theta'_k + \epsilon) \qquad (1)$$

$$Q_k g_k \sin(\phi_k + \Delta\theta_k - \Delta\theta'_k + \epsilon) \qquad (2)$$

where, $\epsilon$ is an arbitrary phase, $g_k$ is the amplitude of the sampled signal output $(I_i,Q_i)$ of A/D converter 10, $\phi_k$ is the information bearing phase angle at the $k^{th}$ sampling instant of the symbol, $\Delta\theta_k$ is the carrier phase rotation arising due to a frequency offset and $\Delta\theta'_k$ is the estimated phase adjustment to compensate for the offset between transmitter and receiver carrier phase angles. A new set of coefficients $(I_k,Q_k)$ is synthesized to compensate for differences in reference oscillator frequencies between transmitter and receiver. This difference causes continual phase shift differences. To reduce errors the present invention must compensate for this phase shift.

Figure 6A:
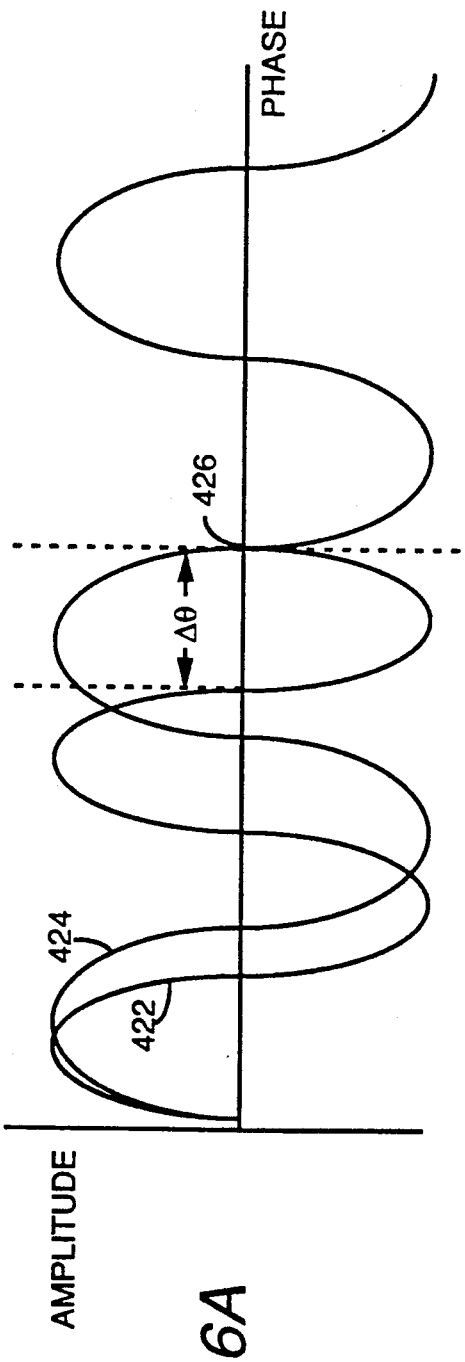
FIG. 6a and 6b are graphical representations of the carrier phase incurred by carrier frequency offset, and the carrier phase adjustment.
Figure 6B:
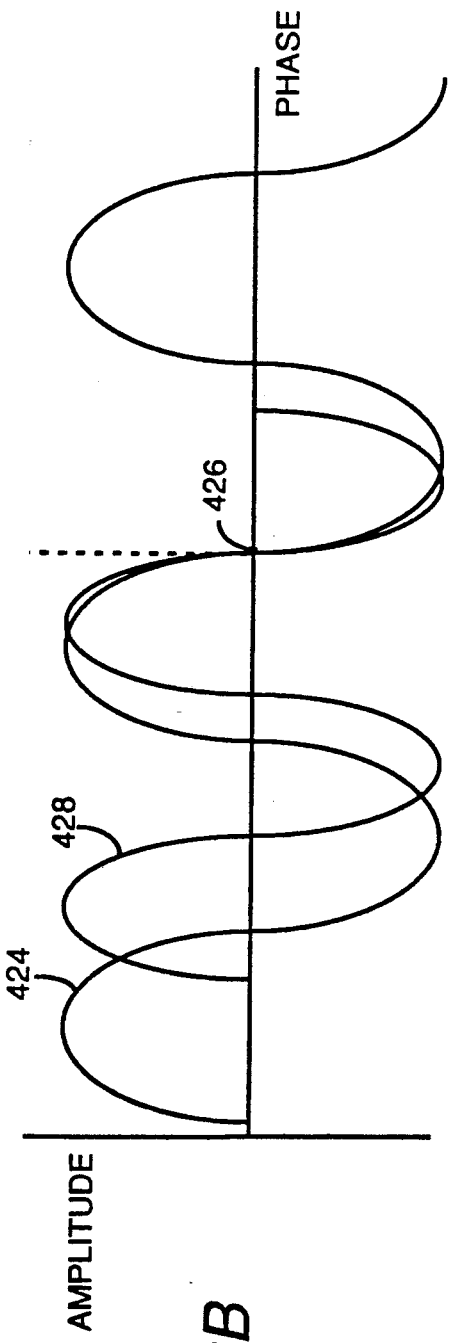

FIG. 6a shows waveform 422 that represents the frequency of the carrier waveform as calculated by the receiver 9 of FIG. 1. Carrier waveform 424 represents the actual carrier waveform sent by transmitter 4 of FIG. 1. $\Delta\theta$ is a phase difference between waveforms 422 and 424 at sampling point 426 introduced by a slight difference in frequencies between the transmitter and receiver. This difference in frequency may result from a mismatch in the oscillator frequencies of the transmitter and receiver. The present invention compensates for this phase shift $\Delta\theta$ by estimating the phase shift $\Delta\theta'$ and synthetically shifting waveform 422 forward as shown in FIG. 6b such that waveforms 424 and 428 are in phase at sampling point 426.

Referring to FIG. 5 again, each in-phase coefficient produced by SPA circuit 30 is passed to delay circuit 32 and temporarily delayed, in this embodiment, for one symbol period. Each quadrature coefficient from the SPA circuit is similarly delayed in delay circuit 34. A cosine detector 33 comprised of multiplier 42, multiplier 44, summer 52 receives an in-phase $I_k$ coefficient directly from the SPA circuit and also receives a previously decoded in-phase coefficient which was delayed in delay circuit 32 denoted as $I_{k-1}$. The cosine detector 33 also receives the quadrature phase coefficient $Q_k$ and a previously decoded quadrature phase coefficient which was delayed in delay circuit 34 denoted as $Q_{k-1}$.

Similarly, a sine detector 35 comprised of multiplier 46, multiplier 48, summer 54 receives the in-phase coefficient $I_k$, the previous delayed coefficient $I_{k-1}$, the quadrature phase coefficient $Q_k$ and the previous delayed quadrature phase coefficient $Q_{k-1}$.

In cosine detector 33, multiplier 42 multiplies the $I_k$ coefficient and the $I_{k-1}$ coefficient and passes the product to summer 52. Multiplier 44 multiplies the $Q_k$ coefficient and the $Q_{k-1}$ coefficient and passes the product to summer 52. Summer 52 adds the two products to produce a signal and passes it to a cosine level check circuit and also to an inverse cosine circuit 76. The cosine level check circuit 62 determines the amplitude of its received signal during a symbol period and creates an output signal related to the detected amplitude as follows:

output=0 if positive
output=1 if negative

In sine detector 35, multiplier 46 multiplies the $Q_k$ coefficient and the $I_{k-1}$ coefficient and passes the product to summer 54. Multiplier 48 multiplies the $I_k$ coefficient and the $Q_{k-1}$ coefficient and passes the product to summer 54. Summer 54 subtracts the product from multiplier 48 from that of multiplier 46 to produce a signal that is passed to a sine level check circuit 64. The sine level check circuit 64 determines the amplitude of its received signal (positive or negative) and creates an output signal related to the detected amplitude as follows:

output=0 if positive
output=1 if negative

The output signals from the cosine level check circuit 62 and the sine level check circuit 64 are passed to decision logic circuit 72. Decision logic circuit 72 produces a signal consisting of pairs of bits, one from the sine level check circuit and one from the cosine level check circuit. Each pair reflects the amplitudes detected by the cosine level check circuit 62 and the sine level check circuit 64. These bits are the transmitted data. The decoding logic is as follows:

| Cosine level check output | Sine level Check output | Bit 1 | Bit 2 |
|---|---|---|---|
| + | + | 0 | 0 |
| + | − | 0 | 1 |
| − | + | 1 | 0 |
| − | − | 1 | 1 |

Symbol timing determined by sample index j and carrier phase adjustment estimation $\Delta\theta$ are critical in reducing the BER performance of a detector. Symbol timing estimation corresponds to determining the best sample, from the point of detection, in each symbol interval. Carrier frequency offset $\Delta\theta$ is manifested as a phase rotation of actual symbol phases. Hence, the estimation of carrier phase adjustment $\Delta\theta$ corresponds to determining the phase adjustment per symbol period. The present invention establishes sample timing and carrier frequency offset error correction by minimizing the error between differential phase angle of a preset synchronization word transmitted as a preamble known to the receiver and a corresponding decoded phase output signal from inverse cosine circuit 76. The process may be mathematically represented as:

$$\min_{\{j,\Delta\theta\}} \left\{ \sum_{i=2}^{N_p} [\Theta_i + \Delta\theta - \Theta_i^e(j)]^2 \right\} \quad (3)$$

where,
j=sample index,
$\Theta_i$=differential phase angle of $i^{th}$ symbol of preamble,
$\Delta\theta$=carrier phase adjustment given to received signal,
$\Theta_i^e(j)$=differentially decoded phase angle corresponding to the $i^{th}$ symbol at the $j^{th}$ sampling index.
$N_p$=number of symbols in the preamble.

If the magnitude of the phase jitter due to additive white Gaussian Noise is less than $\pi/2$ radians and there is no intersymbol interference, then the metric given by equation (3) is a rough approximation to choosing the largest maximum likelihood estimate of the signal to noise ratio for each sample time and frequency offset, averaged over the preamble.

It must be noted that the error minimization described by equation (3) obtains an estimate of the phase adjustment per symbol. The phase adjustment per sample is obtained by dividing $\Delta\theta$ by $N_s$. (In the embodiment of FIG. 5, $N_s=1$.)

The error minimization described by equation (3) is performed by adjust circuit 120 as shown in FIG. 5. Adjustment circuit 120 minimizes the error by adjustments to sample timing j and carrier phase adjustment estimation $\Delta\theta'$ by performing a two-dimensional search over all sample timing adjustments j and phase adjustments $\Delta\theta'$ for the minimum error value. It functions as follows: The number of samples per symbol $N_s$ is predetermined. The A/D converter circuit 10 and sorter circuit 20 output a stream of coefficients $(I_j,Q_1)$ corresponding to each successive symbol. Symbol timing is established by successive use of different sample indices j, starting from $j_{init}$, the index obtained from coarse or frame/slot synchronization, followed by error calculations pertaining to index j performed by adjustment circuit 120. The SPA circuit 30 first applies a fixed carrier phase adjustment $\Delta\theta'$ to a set of samples and determines a corresponding set of $(I_k, Q_k)$ pairs. The sample set is comprised of samples pertaining to the present index taken for all symbols in the preamble. The symbol decoding error for this set of $(I_k, Q_k)$ pairs is determined by adjustment circuit 120 according to the metric (equation (3)) and stored therein. The sample timing index is incremented to its next value and the process repeated for the next sample set. This process is repeated until all sample sets for the first fixed carrier phase adjustment $\Delta\theta'$ are decoded and the symbol decoding errors are determined.

The adjustment circuit 120 then applies the next fixed carrier phase adjustment $\Delta\theta'$ to the next sample set and determines a corresponding decoding error with the use of synchronization word symbols in the preamble 166 of FIG. 2b known by the receiver. These synchronization words are used as a reference to estimate the best sample timing j and carrier phase adjustment $\Delta\theta'$ that minimizes the squared error between the relative phase angles of the reference sequence and the corresponding relative phase angles of the detected sequence. The synchronization word symbols can also be used after initial synchronization to fine tune the frame/slot synchronization. After all fixed carrier phase adjustments $\Delta\theta$ have been applied, the value that minimizes the symbol decoding error is determined. The symbol synchronization can be summarized as follows: Each TDMA slot position (for example the second slot 144 of FIG. 2a) has a unique synchronization word or preamble 166 (FIG. 2b) that is known to the receiver. Frame/slot synchronization as described above must be established before TDMA data 174, 178 is acquired. The coarse frame/slot position is accurate to within $\pm N_1$ samples of the correct position, where $N_1 \leq N_s/2$ and $N_s$ is the number of samples per symbol.

Having established fFrame/slot synchronization, $N_2$ data samples on either side of the established slot synchronization position are stored in a buffer in adjustment circuit 120 of FIG. 5; here $N_2 \geq N_1$. (In the present embodiment $N_s = 10$, therefore 5 samples on either side are stored in the buffer). Each buffered sample is then sequentially used as the starting point by the SPA circuit 30, for locating the optimum sample timing j and carrier phase adjustment $\Delta\theta$. This can be described as a 2-dimensional search to minimize the error described by equation (3) with respect to symbol timing j and carrier phase adjustment $\Delta\theta'$. The carrier phase rotation $\Delta\theta$ is expected to remain relatively constant over several hundred TDMA frames. Hence, for symbol synchronization, the adjustment circuit needs only to perform the 2-dimensional search for the optimum sample timing j and phase adjustment $\Delta\theta$ at start up or at hand-off, and subsequently fix the phase adjustment $\Delta\theta$ and search only for the optimum sampling instant j at the start of each time slot.

It must be noted that the correlation between the preamble 166 of FIG. 2b and decoded sequences, which is the output signal of cosine detector 33 of FIG. 5, is maximized and not the correlation between the preamble 166 of FIG. 2b and received sequences 3 of FIG. 5. Thus, the present invention corrects for the characteristics of the detector in finding the optimum sampling point j and phase adjustment $\Delta\theta$.

Figure 7:
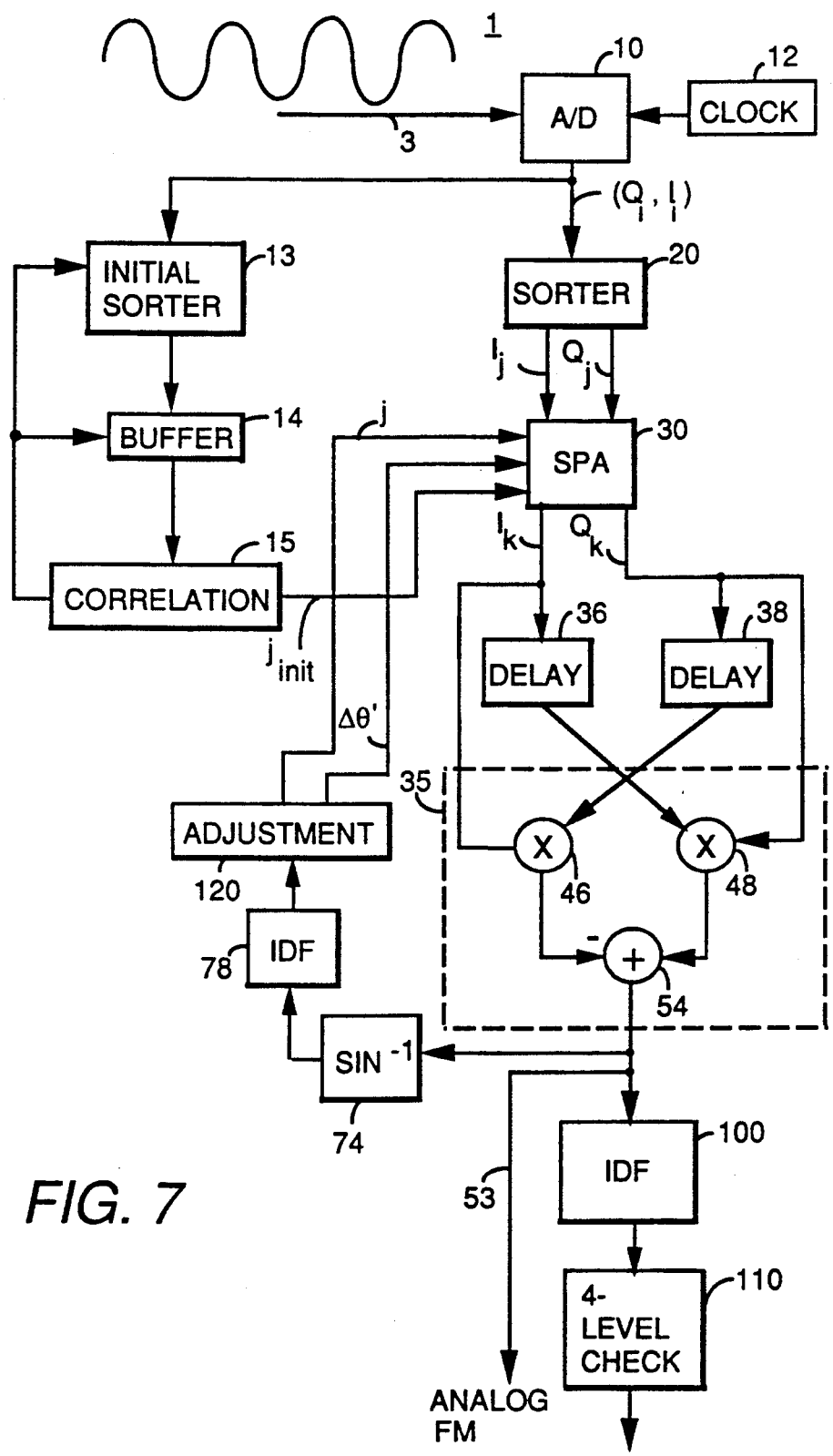
FIG. 7 is a simplified block diagram of a second embodiment of a detector of the present invention.

FIG. 7 is a block diagram of an alternative embodiment of the present invention. This embodiment functions the same as the embodiment of FIG. 5 up to the point in which SPA circuit 30 selects samples to be used in the decoding. In this embodiment, the decoder uses more than one sample per symbol, for example, 10 samples per symbol, $N_s = 10$. By comparison, the embodiment of FIG. 5 employs only one sample per symbol. Samples are passed to the SPA circuit 30 which functions as described above. The output signals of the SPA 30 are passed to delay circuits 36 and 38. Delay circuit 36 receives the in-phase coefficient $I_k$ and delays it for a period of time related to the number of samples per symbol. (For example, assuming there are ten samples per symbol, the in-phase coefficient $I_k$ is delayed for a period being 1/10 of a symbol period.) Similarly delay circuit 38 delays the quadrature coefficient $Q_k$ for the same length of time. These coefficients and their delayed counterparts are passed to sine detector 35. The output signal from the sine detector passes both to an integrate and dump filter (IDF) 100 and an inverse sine circuit 74. The inverse sine circuit 74 creates an output signal related to its input signal by an inverse sine function. The output signal of the inverse sine circuit 74 is passed to a second integrate and dump filter (IDF) 78 which sums the output signal of the inverse sine circuit over a symbol period. The output signal of the IDF 78 represents a transmitted phase angle encoded in the original received signal. The output signal of the IDF 78 is passed to adjustment circuit 120.

IDF 100 receives the signal from the sine detector 35 and sums the signal for a period representing the symbol period. (Assuming there are ten samples per symbol, the IDF 100 will sum the ten samples from the sine detector 35.) After the IDF 100 has summed the signal over an entire signal period, it dumps its sum to the four level check circuit 110. The four level check circuit monitors the output of the IDF 100 and creates an output signal representing one of four possible levels. These four levels are represented in the binary two-bit output signal which represents the decoded information.

Figure 8A:
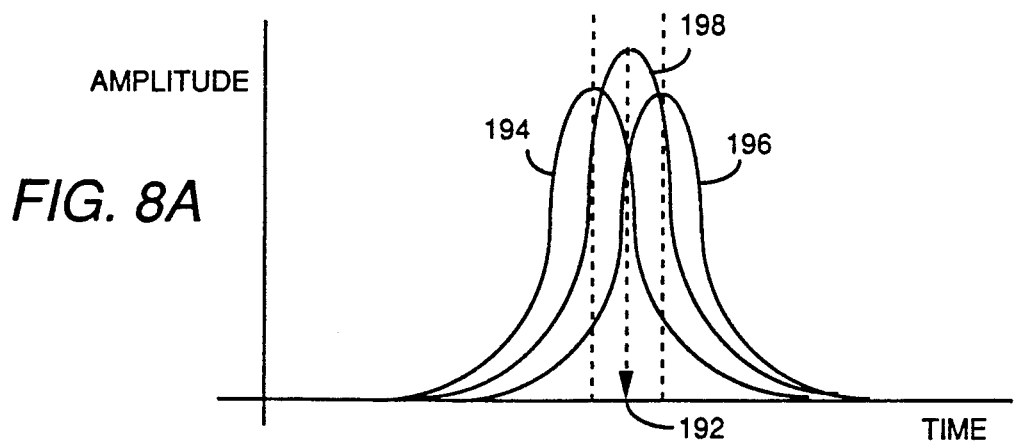
FIG. 8a, 8b and 8c are illustrations of the variation of optimal sampling points due to multipath propagation and signal fading.
Figure 8B:
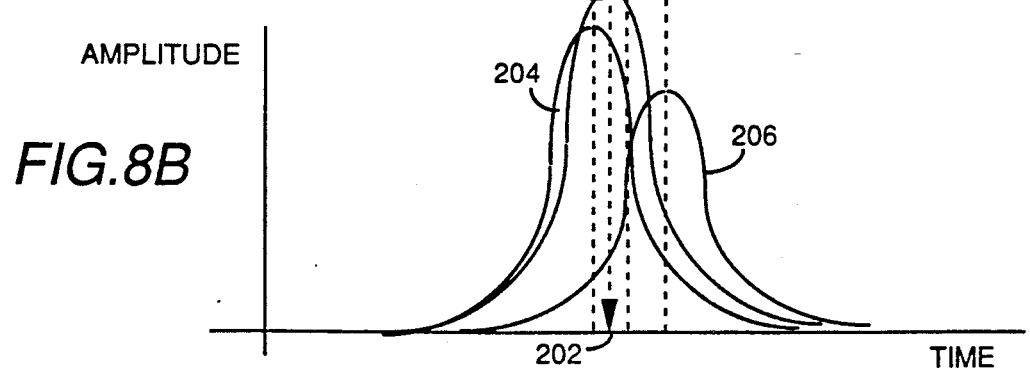
Figure 8C:
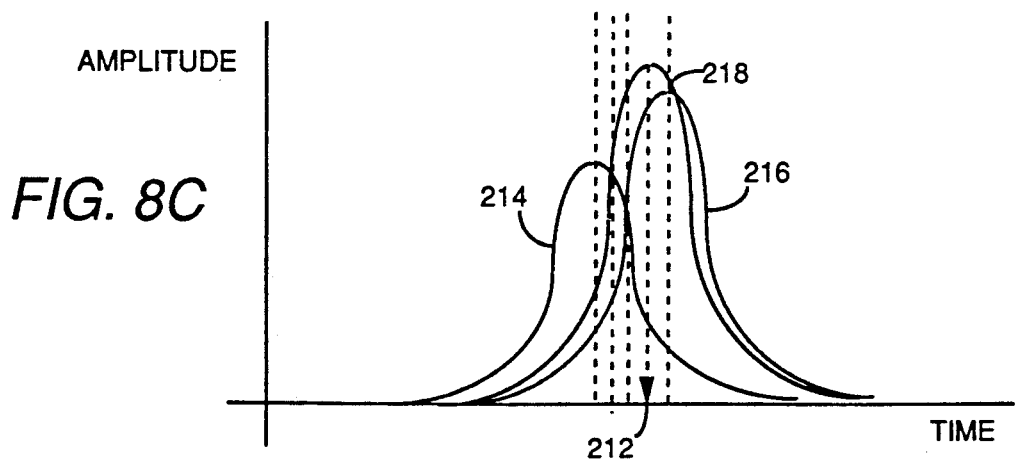

Delay spread causes symbol errors. This effect can be mitigated by using an equalizer. In the absence of an equalizer, the most intuitive way of reducing BER would be to choose an optimal sampling point to minimize the contributions of adjacent symbols. FIGS. 8a, 8b, and 8c illustrate the effect of a small delay spread on the present invention. Two rays of a multipath system are assumed to be received in three different situations as illustrated by FIGS. 8a, 8b, and 8c.

In FIG. 8a, an original received signal 194 is followed by a delayed signal 196, an echo, of equal amplitude. Let the optimal sampling point 192 pertain to the center of the combined waves 198. In FIG. 8b, an original received signal 204 is followed by echo 206 of lesser amplitude. Now if the optimal sampling point 202 pertains to the center of the combined waves 208, then the optimal sampling point has shifted from point 192 to 202 due to the differences in relative amplitudes between the original received signal and the echo. Similarly, FIG. 8c shows an original received signal 214 followed by echo 216 of greater amplitude. If the optimal sampling point 212 pertains to the center of the combined waves 218, then the optimal sample timing 192, 202, 212 in each situation 8a, 8b, and 8c varies with the relative amplitudes of the signal and the corresponding delayed signal.

The present invention implements optimal sample timing estimation making the detector more robust to delay spread. However, this action is only useful for delay spreads of approximately one to two tenths of a symbol period.

It must be noted that the minimization performed by the adjustment circuit 120 of FIGS. 5 is only over the preamble sequence 166 of FIG. 2b.

The detector of FIG. 5 or 7 eliminates the limiter of FIGS. 3 and 4 and hence does not place severe restrictions on data rate and filtering constraints. The elimination of the software implemented limiter reduces the processing requirements in implementing the detector. The detector 1 of FIG. 5 or 7 has an adjustment circuit 120 that performs integrated sample timing j and carrier frequency error estimation $\Delta\theta$. The sample timing recovery scheme reduces the BER performance of the detector when there is a small amount of delay spread.

The present invention can be used to demodulate analog FM signals that are commonly employed in conventional FM radio broadcasts since it employs a differential type demodulation scheme. To receive conventional FM radio broadcasts, the adjustment circuit 120, and the SPA circuit must be deactivated in order not to adjust the sample timing j and phase adjustment $\Delta\theta'$. Either output lead 53, 55 of the cosine detector 33 or sine detector 35 respectively can be used as the output of the detector for analog FM as shown in FIG. 5. Output lead 53 from sine detector 35 can be used as the output for the discriminator for analog FM as shown in FIG. 7. The sampling rate of the A/D converter 10 must also be increased. The detector now may be used for receiving analog FM radio signals.

The foregoing describes a digital radio receiver that eliminates the need for a limiter and incorporates an adjustment circuit that adjusts sampling timing and carrier phase adjustment. The BER performance of the detector indicates that it can be used in mobile receivers where complexity has to be low and where the delay spread is less than 0.2 of a symbol duration. This detector will also be very useful in portable radio applications where complexity of the receiver is low and delay spread relative to the symbol period does not exceed 10%.

The sine/cosine detector also can receive conventional analog FM radio broadcasts by deactivating the adjustment circuit, the SPA circuit, and the IDF circuit. The differential detector also can decode other digital modulation schemes, such as four-level digital FM and four-level continuous phase frequency shift keying (CPFSK) with modulation index h=0.25, which can be represented as quadrature phase signals.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. In the receiver of a cellular telephone for receiving phase angles encoded in a received signal, a digital discriminator, said discriminator comprising:
    a) heterodyne for converting said received signal to an intermediate frequency (IF) signal;
    b) an analog to digital (A/D) converter coupled to sample said IF signal and create a digital output signal comprised of a plurality of samples, each sample comprising a quadrature coefficient and an in-phase coefficient;
    b) a sorter circuit coupled to receive the digital output signal and provide a predetermined number of samples for decoding;
    c) a sample and phase adjustment (SPA) circuit coupled to receive the samples provided by the sorter circuit and receive a carrier phase adjustment, for creating output samples each having an in-phase coefficient and a quadrature coefficient based upon the carrier phase adjustment and for selecting samples for decoding based upon a received sample timing index;
    d) a first delay circuit coupled to the SPA circuit, to receive and delay the quadrature coefficient of the output sampels of the SPA circuit for a predetermined period representing a single symbol period, creating a first delayed signal;
    d) a second delay circuit coupled to the SPA circuit, to receive and delay the in-phase coefficient of the output samples of the SPA circuit for a predetermined period representing a single symbol period, creating a second delayed signal;
    f) a cosine detector coupled to receive the quadrature coefficient, the first delayed signal, the in-phase coefficient and the second delayed signal, for creating an output signal that is a cosine function of a phase angle encoded in the in-phase coefficient and quadrature coefficient;
    g) a sine detector coupled to receive the quadrature coefficient, the first delayed signal, the in-phase coefficient and the second delayed signal, for creating an output signal that is a sine function of a phase angle encoded in the in-phase coefficient and quadrature coefficient;
    h) a cosine level check circuit coupled to receive the output signal from the cosine detector for producing an output signal based upon the amplitude of the cosine detector output signal;
    i) a sine level check circuit coupled to receive the output signal from the sine detector for producing an output signal based upon the amplitude of the sine detector output signal;
    j) a decision logic circuit coupled to receive the output signals of the sine level check circuit and the cosine level check circuit and for producing an output signal consisting of pairs of encoded bits based upon the signals received, one bit of each pair being determined by the cosine level check circuit output signal and the other bit of said pair being determined by the sine level check circuit output signal;
    k) an inverse trigonometric function circuit coupled to a corresponding trigonometric level check circuit for creating a symbol phase angle; and
    l) an adjustment circuit coupled to said inverse trigonometric circuit for calculating a decoding error between the decoded phase angle for each symbol in a preamble and a respective one of a predetermined set of phase angles stored by the adjustment circuit, and for adjusting the sample timing and carrier phase adjustment to minimize the decoding error.

2. The receiver of claim 1 wherein the digital detector minimizes the decoding error by the steps of:
    a) performing a coarse frame/slot synchronization to produce a plurality of established frame/slot synchronizations;

b) buffering a number of samples N on either side of each established frame/slot synchronization position for each symbol in a preamble, N being at least as great as the number of samples per symbol;

c) resetting a lowest error memory means, a best sample timing memory means, and a best carrier phase adjustment memory means when a new synchronization is to begin;

d) setting the carrier phase adjustment to an initial value;

e) setting the sample timing index to an initial value;

f) setting the accumulated error to zero;

g) sending a current buffer sample corresponding to symbol index and sample timing index to the SPA circuit;

h) subtracting the output signal of the modulo-$2\pi$ circuit from the phase angle known by the adjustment circuit and the carrier phase adjust and adding it to the accumulated error so as to update the accumulated error;

i) incrementing the symbol index;

j) repeating steps "g" through "i" for all symbols in the preamble;

k) comparing the updated accumulated error to the value stored in the lowest error memory means and, in the event that the updated accumulated error is lower than the set value stored in the lowest error memory means, replacing the value stored in the lowest error memory means with the updated accumulated error, replacing the best sample timing with the sample timing index, replacing the best carrier phase adjustment with carrier phase adjustment;

l) incrementing the sample timing index;

m) repeating steps "f" through "l" until all sample timing indices for the entire buffer have been used;

n) incrementing the carrier phase adjustment index;

o) repeating steps "f" through "m" for all carrier phase adjustments; and p) sending the best sample timing to the SPA circuit to be used as the sample timing index and the best carrier phase adjustment index to the SPA circuit to be used as the carrier phase adjustment until a new synchronization is to begin.

3. The receiver of claim 1 wherein the A/D converter samples at a rate being at least four times the intermediate frequency.

4. The receiver of claim 1 wherein the adjustment circuit adjusts the sample timing index and carrier phase adjustment at the start of a frame to determine the best sample timing index and carrier phase adjustment, and once found, keeps the carrier phase adjustment constant and varies the sample timing adjustment during subsequent time slots, thereby allowing a frame/slot synchronization followed by symbol synchronization.

5. The receiver of claim 1 wherein the received IF signal is from a conventional analog FM radio signal, where a larger number of samples per symbol are processed, the adjustment and SPA circuits are deactivated so as to be nonfunctional, and the output signal of the sine detector comprises an FM receiver output signal.

6. The receiver of claim 1 wherein the received IF signal is a conventional analog FM radio signal, where a larger number of samples per symbol are processed, the adjustment and SPA circuits are deactivated so as to be non-functional, and the output signal of the cosine detector is coupled directly to an FM output.

7. The receiver of a receiver of a cellular telephone for receiving symbol phase angles encoded in a received signal comprising:

a) an analog to digital (A/D) converter coupled to sample said received signal and create a digital output signal comprised of a plurality of samples, each sample comprising a quadrature coefficient signal and an in-phase coefficient signal;

b) a sorter circuit coupled to receive the digital output signal and select more than one sample per symbol based upon a received sample timing adjustment;

c) a sample and phase adjustment (SPA) circuit coupled to receive the selected samples provided by the sorter circuit and a carrier phase adjustment, for creating SPA output samples based upon the carrier phase adjustment, each SPA output sample comprising a quadrature coefficient and an in-phase coefficient;

d) a first delay circuit coupled to the SPA circuit to receive and delay the quadrature coefficient from the SPA circuit for a predetermined period pertaining to $1/N_s$, where $N_s$ is the number of samples per symbol, creating a first delayed signal;

e) a second delay circuit coupled to the SPA circuit to receive and delay the in-phase coefficient from the SPA circuit for said predetermined period pertaining to $1/N_s$, creating a second delayed signal;

f) a sine detector coupled to receive the quadrature coefficient signal, the first delayed signal, the in-phase coefficient signal and the second delayed signal, for creating an output signal that is a sine function of a phase angle encoded in the in-phase coefficient and quadrature coefficient;

g) an integrate and dump filter (IDF) coupled to receive the output signal of the sine detector and sum it over a symbol period, then dump the sum to an output, the sum representing a decoded trigonometric sine function of a phase angle for the currently-present symbol;

h) a four level check circuit coupled to receive the output signal of the IDF circuit and determine one of four possible levels based upon the amplitude of the signals received, for creating a signal comprising a pair of bits representing the transmitted data;

i) an inverse sine circuit coupled to receive the output signal of the sine detector for creating a portion of a symbol phase angle therefrom;

j) a second integrate and dump filter (IDF2) coupled to the inverse sine circuit to receive the output signal of the inverse sine detector and sum it over a symbol period, then dump the sum to an output, the sum representing a decoded symbol phase angle;

k) an adjustment circuit coupled to receive the output signal of the IDF2 for calculating a decoding error between the decoded symbol phase angle for each symbol in a preamble and a respective one of a predetermined set of phase angles stored by the adjustment circuit, and for adjusting the sample timing and carrier phase adjustment to minimize the decoding error.

8. The receiver of claim 7 wherein the digital detector minimizes the decoding error by the steps of:

a) performing a coarse frame/slot synchronization to produce a plurality of established frame/slot synchronizations;

b) buffering a number of samples N on either side of each established frame/slot synchronization position for each symbol in a preamble, N being at least as great as the number of samples per symbol;

c) resetting a lowest error memory means, a best sample timing memory means, and a best carrier phase adjustment memory means when a new synchronization is to begin;

d) setting the carrier phase adjustment to an initial value;

e) setting the sample timing index to an initial value;

f) setting the accumulated error to zero;

g) sending a current buffer sample corresponding to symbol index and sample timing index to the SPA circuit;

h) subtracting the output signal of the modulo-$2\pi$ circuit from the phase angle known by the adjustment circuit and the carrier phase adjust and adding it to the accumulated error so as to update the accumulated error;

i) incrementing the symbol index;

j) repeating steps "g" through "i" for all symbols in the preamble;

k) comparing the updated accumulated error to the value stored in the lowest error memory means and, in the event that the updated accumulated error is lower than the set value stored in the lowest error memory means, replacing the value stored in the lowest error memory means with the updated accumulated error, replacing the best sample timing with the sample timing index, replacing the best carrier phase adjustment with carrier phase adjustment;

l) incrementing the sample timing index;

m) repeating steps "f" through "l" until all sample timing indices for the entire buffer have been used; and n) incrementing the carrier phase adjustment index; adjustments; and p) sending the best sample timing to the SPA circuit to be used as the sample timing index and the best carrier phase adjustment index to the SPA circuit to be used as the carrier phase adjustment until a new synchronization is to begin.

9. The receiver of claim 7 wherein the A/D converter samples at a rate being at least four times the intermediate frequency.

10. The receiver of claim 7 wherein the adjustment circuit adjusts the sample timing index and carrier phase adjustment at the start of a frame to determine the best sample timing index and carrier phase adjustment, and once found, keeps the carrier phase adjustment constant and varies the sample timing adjustment during subsequent time slots, thereby allowing a frame/slot synchronization followed by symbol synchronization.

11. The receiver of claim 7 wherein the received IF signal is from a conventional analog FM radio signal, where a larger number of samples per symbol are processed, the adjustment and SPA circuits are deactivated so as to be nonfunctional, and the output signal of the sine detector is coupled directly to an FM output.

12. The receiver of claim 7 wherein the received IF signal is from a conventional analog FM radio signal, where a larger number of samples per symbol are processed, the adjustment and SPA circuits are deactivated so as to be nonfunctional, and the output signal of the cosine detector is coupled directly to an FM output.

* * * * *